(12) United States Patent
Tang et al.

(10) Patent No.: US 9,780,799 B2
(45) Date of Patent: *Oct. 3, 2017

(54) METHOD AND SYSTEM FOR AN ANALOG-TO-DIGITAL CONVERTER WITH NEAR-CONSTANT COMMON MODE VOLTAGE

(71) Applicant: Maxlinear, Inc., Carlsbad, CA (US)

(72) Inventors: Yongjian Tang, Carlsbad, CA (US); Hao Liu, Carlsbad, CA (US)

(73) Assignee: Maxlinear, Inc., Carlsbad, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/939,473

(22) Filed: Nov. 12, 2015

(65) Prior Publication Data

US 2017/0141784 A1  May 18, 2017
US 2017/0250698 A9  Aug. 31, 2017

Related U.S. Application Data

(63) Continuation of application No. 14/592,020, filed on Jan. 8, 2015, now Pat. No. 9,197,239.

(Continued)

(51) Int. Cl.
*H03M 1/12* (2006.01)
*H03M 1/06* (2006.01)
*H03M 1/44* (2006.01)

(52) U.S. Cl.
CPC ......... *H03M 1/0609* (2013.01); *H03M 1/442* (2013.01)

(58) Field of Classification Search
CPC ........ H03M 1/46; H03M 1/78; H03M 1/1245; H03M 1/442; H03M 1/466; H03M 1/468; H03M 1/002; H03M 1/123; H03M 1/1004; H03M 1/0682; H03M 1/0909; H03M 1/0609; H03F 3/45; H03F 3/45219;

(Continued)

(56) References Cited

U.S. PATENT DOCUMENTS 7,183,854 B2 * 2/2007 Regier ................ H03G 1/0088
                                                    330/254
8,604,962 B1 * 12/2013 Lewyn ................ H03M 1/0863
                                                    341/161

(Continued)

*Primary Examiner* — Lam T Mai
(74) *Attorney, Agent, or Firm* — McAndrews, Held & Malloy, Ltd.

(57) ABSTRACT

Methods and systems for an analog-to-digital converter (ADC) with constant common mode voltage may include in an ADC comprising a sampling switch on a first input line to the ADC, a sampling switch on a second input line to the ADC, N switched capacitor pairs and M single switched capacitors on the first input line, and N switched capacitor pairs and M single switched capacitors on the second input line: sampling an input voltage by closing the sampling switches, opening the sampling switches and comparing voltage levels between the input lines, iteratively switching the switched capacitor pairs between a reference voltage (Vref) and ground based on the compared voltage levels, and iteratively switching the single switched capacitors between ground and voltages that are a fraction of Vref, which may equal $Vref/2^x$ where x ranges from 0 to m−1 and m is a number of single switched capacitors per input line.

20 Claims, 11 Drawing Sheets

Related U.S. Application Data

(60) Provisional application No. 61/924,733, filed on Jan. 8, 2014.

(58) Field of Classification Search
CPC ..... H03F 3/45179; H03F 1/08; H04L 25/061; H04L 9/0866; G09C 1/00; G06F 7/588
USPC .......... 341/122, 172, 155; 330/69, 129, 253, 330/259; 375/319
See application file for complete search history.

(56) References Cited

U.S. PATENT DOCUMENTS

| | | | | |
|---|---|---|---|---|
| 8,730,074 | B1* | 5/2014 | Cowley | H03M 1/183 |
| | | | | 341/118 |
| 8,736,480 | B1* | 5/2014 | Cowley | H03M 1/0626 |
| | | | | 341/118 |
| 9,197,239 | B2* | 11/2015 | Tang | H03M 1/442 |
| 2012/0105265 | A1* | 5/2012 | Agarwal | H03M 1/002 |
| | | | | 341/172 |
| 2012/0319880 | A1* | 12/2012 | Matsumoto | H03M 1/0682 |
| | | | | 341/122 |

* cited by examiner

METHOD AND SYSTEM FOR AN ANALOG-TO-DIGITAL CONVERTER WITH NEAR-CONSTANT COMMON MODE VOLTAGE

CROSS-REFERENCE TO RELATED APPLICATIONS/INCORPORATION BY REFERENCE

This application is a continuation of application Ser. No. 14/592,020 filed on Jan. 8, 2015, which makes reference to and claims priority to U.S. Provisional Application Ser. No. 61/924,733 filed on Jan. 8, 2014. Each of the above identified applications is hereby incorporated herein by reference in its entirety.

FIELD

Certain embodiments of the disclosure relate to communication. More specifically, certain embodiments of the disclosure relate to a method and system for an analog-to-digital converter with near-constant common mode voltage.

BACKGROUND

Conventional methods of analog to digital conversion can be inefficient and/or ineffective. Further limitations and disadvantages of conventional and traditional approaches will become apparent to one of skill in the art, through comparison of such systems with some aspects of the present invention as set forth in the remainder of the present application with reference to the drawings.

BRIEF SUMMARY

A system and/or method for an analog-to-digital converter with near-constant common mode voltage substantially as shown in and/or described in connection with at least one of the figures, as set forth more completely in the claims.

Various advantages, aspects and novel features of the present disclosure, as well as details of an illustrated embodiment thereof, will be more fully understood from the following description and drawings.

DETAILED DESCRIPTION

Figure 1A:
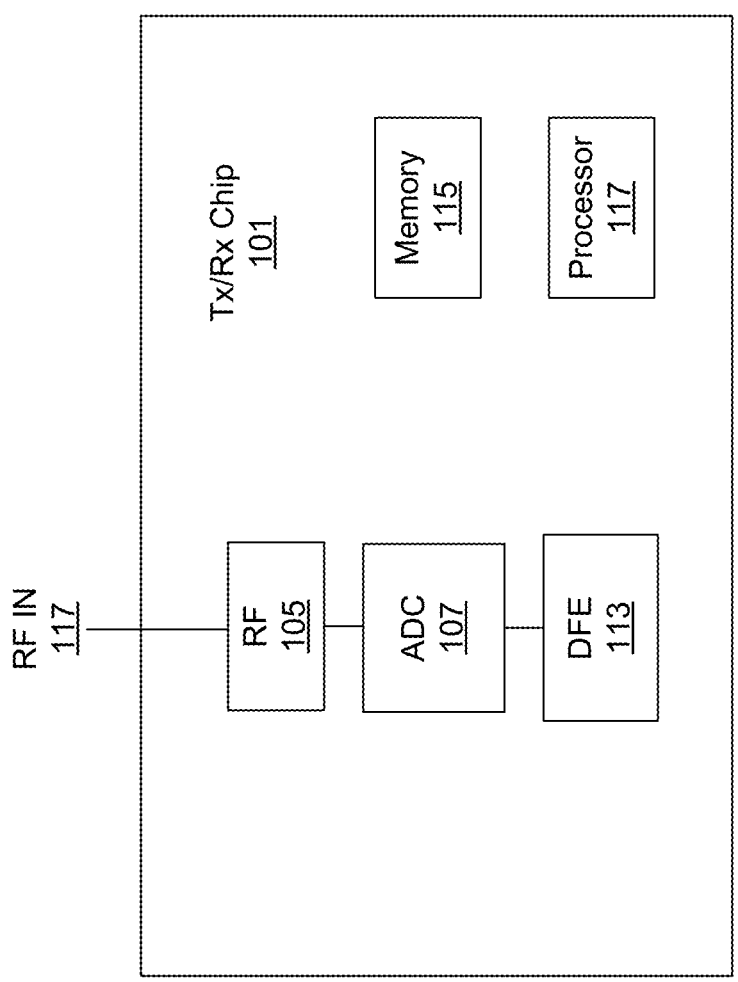
FIG. 1A is a diagram of an exemplary communication device with an analog-to-digital converter with near-constant common mode voltage, in accordance with an example embodiment of the disclosure.

Certain aspects of the disclosure may be found in a method and system for an analog-to-digital converter with near-constant common mode voltage. Exemplary aspects may comprise, in an analog-to-digital converter (ADC) comprising sampling switches on each of two input lines to the ADC, N double-sided switched capacitors, and M single-sided switched capacitors on each input line: sampling an input voltage by closing the sampling switches, opening the sampling switches and comparing voltage levels between the input lines, iteratively switching the double-sided switched capacitors between a reference voltage (Vref) and ground based on the compared voltage levels, and iteratively switching the single-sided switched capacitors between ground and voltages that are a fraction of Vref. The voltages that are a fraction of Vref may equal $Vref/2^x$ where x ranges from 0 to m−1 and m is a number of single-sided switched capacitors per input line. A common mode offset of the ADC may be less than $V_{ADC\_fs}128 + V_{ADC\_fs}/256 + V_{ADC\_fs}/512 + V_{ADC\_fs}/1024$ when m equals 4 and $V_{ADC\_fs}$ is the full-scale voltage of the ADC. The single-sided switched capacitors and the double-sided switched capacitors may be controlled utilizing successive approximation register (SAR) logic. The voltage levels may be compared utilizing a comparator. Outputs of the comparator may be coupled to the SAR logic. The sampling switches may be controlled utilizing bootstrapping circuits. The capacitance values of the double-sided switched capacitors may be binary coded. The most significant bit (MSB) may be determined using one of the double-sided switched capacitors, and the least significant bit (LSB) may be determined using one of the single-sided switched capacitors.

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set {(x), (y), (x, y)}. In other words, "x and/or y" means "one or both of x and y". As another example, "x, y, and/or z" means any element of the seven-element set {(x), (y), (z), (x, y), (x, z), (y, z), (x, y, z)}. In other words, "x, y and/or z" means "one or more of x, y and z". As utilized herein, the term "exemplary" means serving as a non-limiting example, instance, or illustration. As utilized herein, the terms "e.g.," and "for example" set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled or not enabled (e.g., by a user-configurable setting, factory trim, etc.).

FIG. 1A is a diagram of an exemplary communication device with an analog-to-digital converter (ADC) with near-constant common-mode voltage, in accordance with an example embodiment of the disclosure. Referring to FIG. 1A, there is shown a receiver 101 chip comprising a radio frequency (RF) module 105, an analog-to-digital converter (ADC) 107, a digital front end (DFE) 113, a memory 115, and a processor 117. In an example scenario, the receiver chip comprises a single CMOS chip. In another example scenario, the receiver chip comprises a plurality of chips.

The receiver 101 may be in and/or part of a transceiver, for example, and may be utilized for receiving satellite television signals, cable television signals, or any RF signal carrying multiple channels of data desired by a user. In an example scenario, the receiver 101 may comprise a set-top box and/or set-top box functionality. In this example, the receiver 101 may be operable to receive satellite, cable, or terrestrial television signals, down-convert and process the signals for communication to a display device, such as a television, for example.

The RF module 105 may comprise one or more RF receive (Rx) and transmit (Tx) paths for receiving signals from a satellite system, cable TV head-end, and/or terrestrial TV antennas, for example. The RF module 105 may comprise impedance matching elements, LNAs, power amplifiers, variable gain amplifiers, and filters, for example. The RF module 105 may thus be operable to receive, amplify, and filter RF signals before communicating them to the ADC 107.

The ADC 107 may comprise a wideband and/or time-interleaved ADC and may be operable to convert received analog signals to digital signals. In an example scenario, the ADC 107 may utilize double-side switching and scaled reference voltages that result in near constant common-mode voltage during operation.

The digital front end 113 may comprise circuitry for receiving samples from the ADC 107 and communicating them in a single data stream to the processor 117. The processor 117 may comprise a general purpose processor, such as a reduced instruction set computing (RISC) processor, for example, that may be operable to control the functions of the receiver 101. For example, the processor 117 may configure the switches 109 in an open or closed position. Additionally, the processor 117 may demodulate baseband signals received from the digital front end 113.

The memory 115 may comprise a programmable memory module that may be operable to store software and data, for example, for the operation of the receiver 101. Furthermore, the memory 115 may store switching states for the ADC 107.

Figure 1B:
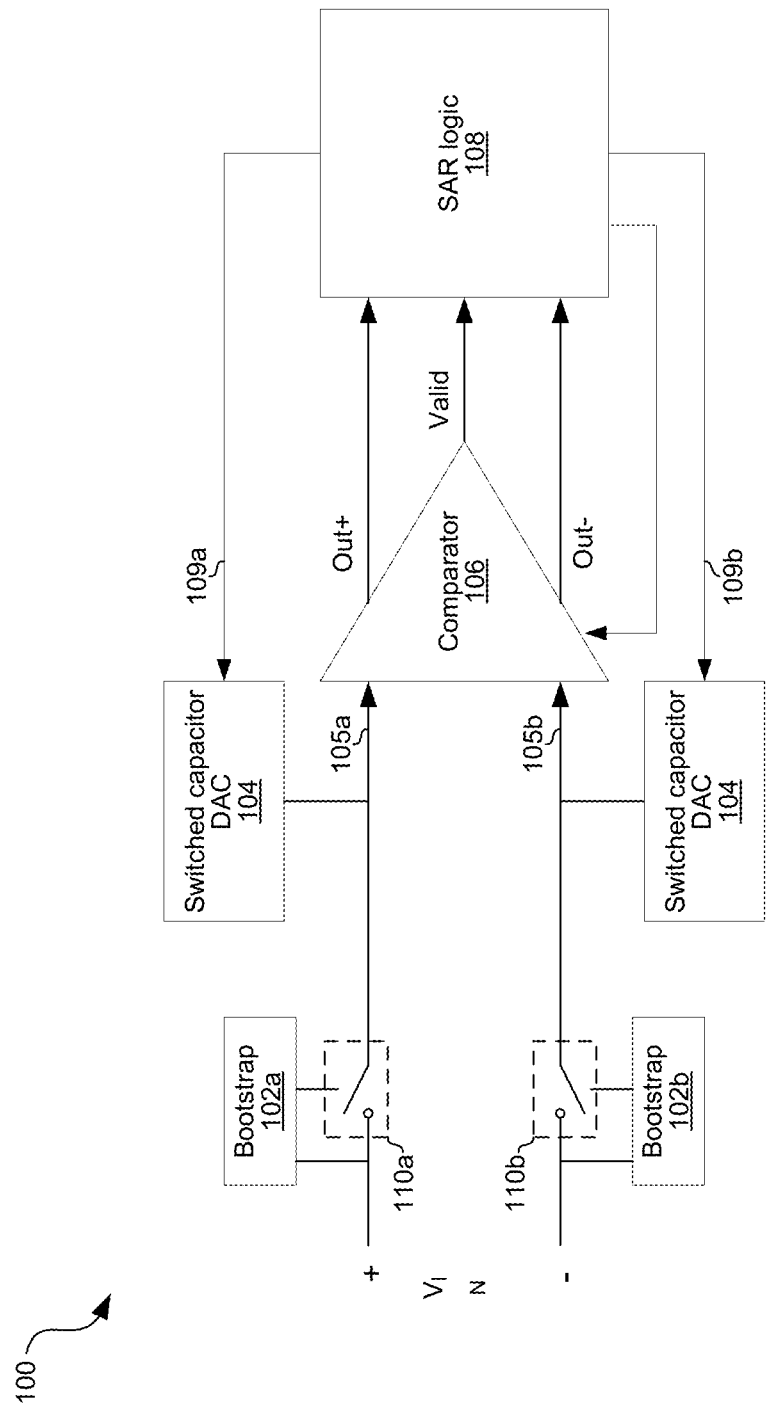
FIG. 1B depicts an analog-to-digital converter (ADC) in accordance with an example implementation of this disclosure.

FIG. 1B depicts an example analog-to-digital converter (ADC) in accordance with an implementation of this disclosure. The ADC 100 comprises switches 110a and 110b, bootstrapping circuits 102a and 102b, switched capacitor DAC 104 (represented as two blocks in FIG. 1B for clarity of illustration), comparator 106, and successive approximation register (SAR) logic 108.

In operation, $V_{IN}$—an analog voltage to be converted to digital—may be sampled onto input lines 105a and 105b by closing switches 110a and 110b utilizing the bootstrapping circuits 102a and 102b. The switches 110a and 110b may then be opened and the sampled analog voltage may be converted to a digital bit via the comparator 106, the SAR logic 108, and the DAC 104. For each bit, the output of the comparator 105 may be fed to the SAR logic 108 which then controls the DAC 104 accordingly via control signals 109a and 109b. Example conversions are described below with reference to the remaining figures.

Figure 2:
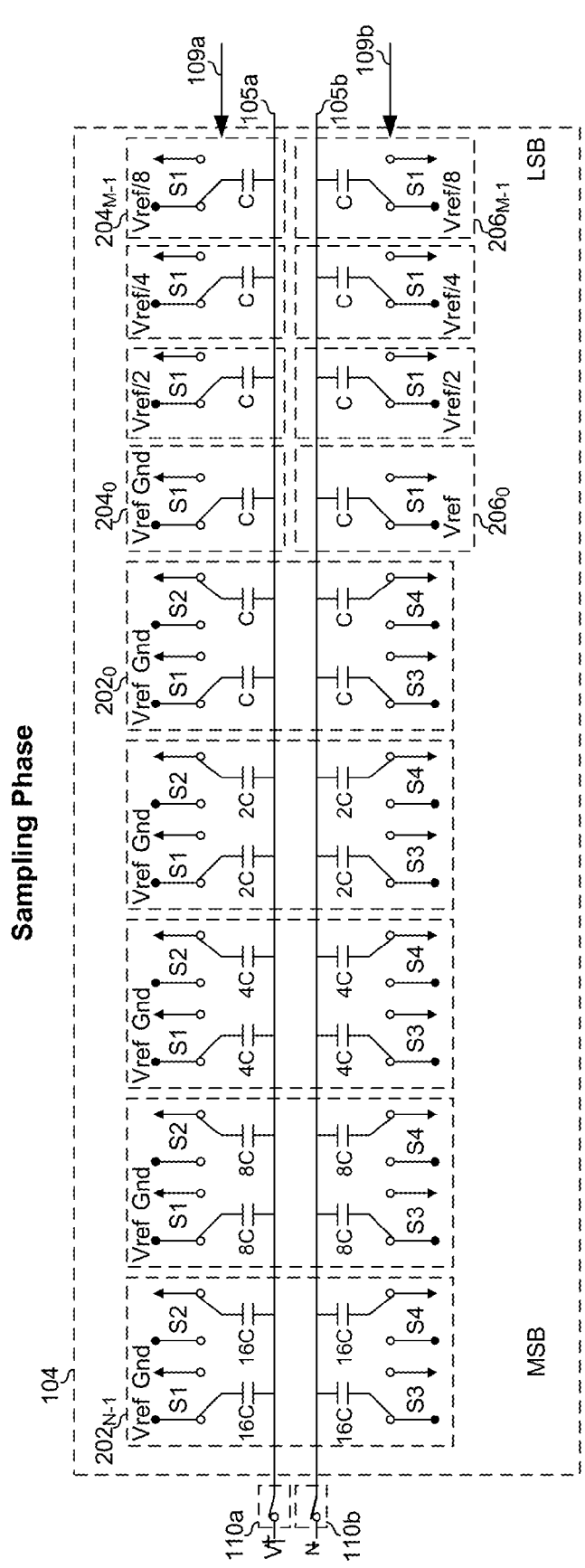
FIG. 2 depicts the ADC of FIG. 1B while the input voltage is sampled by the ADC.

Shown again in FIG. 2 are the switches 110a and 110b, the signal lines 105a and 105b, the control signals 109a and 109b, and the DAC 104. The DAC 104 performs (N+M+1)-bit conversions and comprises N (an integer) double-sided switched capacitors 202, M (an integer) single-sided switched capacitors 204, and M single-sided switched capacitors 206. FIG. 2 may share any and all aspects of the elements of FIGS. 1A and 1B. Values of N=5 and M=4 (for 10-bit conversions) are used for illustration, but are not limiting, and other values of N and M are possible and contemplated by the disclosure. As illustrated in FIG. 2, the capacitance values in the cells may be binary coded, i.e., 16 C, 8 C, 4 C, 2 C, and C. In addition, the voltages in each of the single-sided switched capacitors 204 and 206 may be a fraction of Vref defined by $Vref/2^x$, where x ranges from 0 to m−1, m being the number of single-sided switched capacitors on each of the input lines 105a and 105b. In this example, the initial connection of single-side switches are then Vref, Vref/2, Vref/4, and Vref/8.

Each circuit $202_n$ ($0 \leq n \leq N-1$) comprises four switches S1, S2, S3, S4, each of which is switchable to couple one side of $2^n$ unit capacitances between Vref (represented as filled circles in elements 202) and GND (represented as filled triangles in elements 202). The switches may be controlled by signals 109a and 109b.

Each circuit $204_m$ and $206_m$ ($0 \leq m \leq M-1$) comprises one switch S1 that may be switched to couple one side of unit capacitance C between $Vref/(2^m)$ and GND. The switches may be controlled by signals 109a and 109b.

In FIG. 2, the switches 110a and 110b may be closed for sampling $V_{IN}$. After a sufficient settling time, the switches 110a and 110b may be opened and a conversion may begin. During the sampling phase of FIG. 2, switches S1 and S3 in the circuits $202_n$ may be coupled to Vref while the switches S2 and S5 may be coupled to ground, so that the associated capacitors may be charged to Vref-$V_{in+/-}$ and $V_{in+/-}$. The switches S1 in the circuits $204_m$, $206_m$ may be coupled to ground so that the associated capacitors may be charged to a voltage of $V_{in+}$ or $V_{in-}$. With the capacitors charged to appropriate voltages based on the input voltage and reference voltage Vref, a conversion to a binary bit may commence in each cell.

Figure 3A:
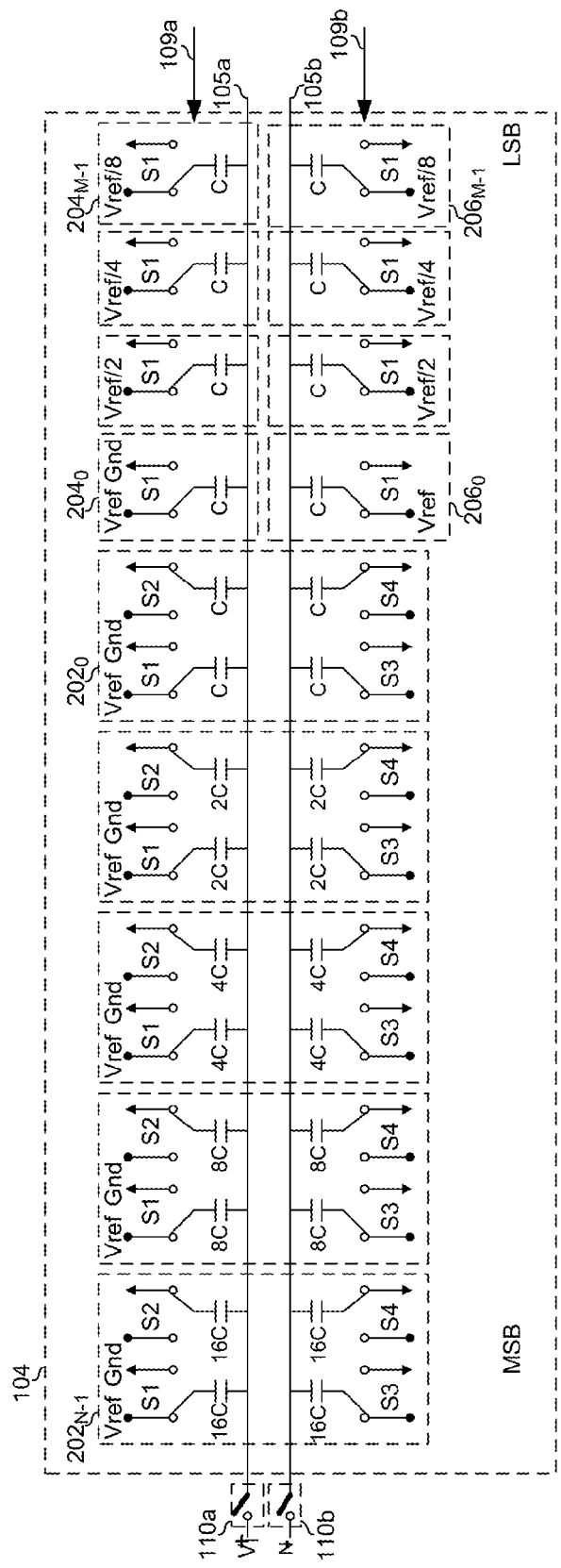
FIG. 3A depicts the ADC of FIG. 1B during a comparison for determining the 1st bit (the most significant bit).

FIG. 3A depicts the ADC of FIG. 1B during a comparison for determining the 1$^{st}$ bit (the most significant bit). FIG. 3A may share any and all aspects of the elements of FIGS. 1A-2. During the MSB comparison shown in FIG. 3A, the switches S1 and S3 in the circuits $202_n$ and the switches S2 and S5 may be coupled as described in FIG. 2. If the voltage on line 105a is larger than the voltage on line 105b (i.e., Vin is >½ the full-scale voltage), then the determined bit is '1' since the output of the comparator 106, with input signals 105a and 105b, would be high. Conversely, if the voltage on line 105a is smaller than the voltage on line 105b (i.e., Vin is less than ½ the full-scale voltage), then the output of the comparator 106 is '0'.

Figure 3B:
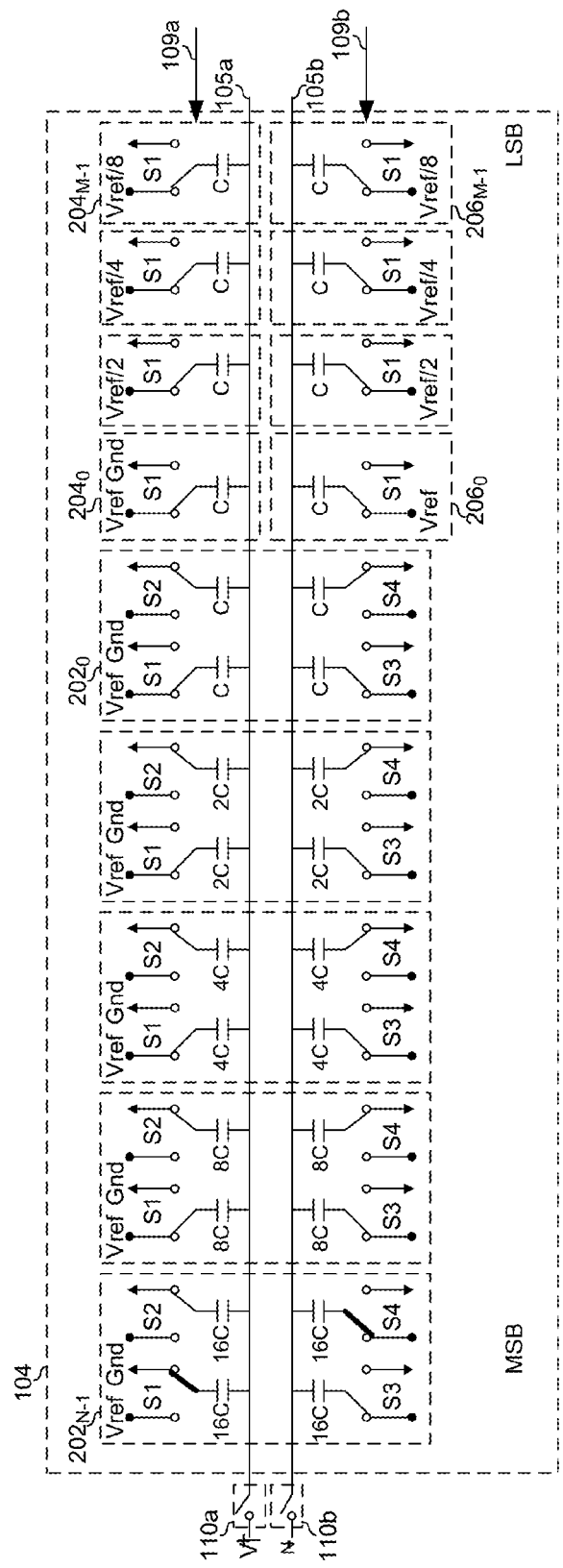
FIG. 3B depicts the ADC of FIG. 1B during a comparison for determining the 2nd bit, assuming the result of the comparison in FIG. 3A was a '1'.
Figures 6A, 6B:
FIG. 6A depicts the change in the comparator inputs of the ADC of FIG. 1B after transitioning from the state shown in FIG. 3A to the state shown in FIG. 3B.
FIG. 6B depicts the change in the comparator inputs of the ADC of FIG. 1B that would have occurred if a single sided switch arrangement had been used for bit N−1.

FIG. 3B depicts the ADC of FIG. 1B during a comparison for determining the 2$^{nd}$ bit, assuming the result of the comparison in FIG. 3A was a '1'. FIG. 3B may share any and all aspects of the elements of FIGS. 1A-3A. The bold lines in FIG. 3B correspond to switches that have changed position relative to FIG. 3A. As shown, S1 of $202_{N-1}$ has been switched to GND and S4 has been switched to Vref. The resulting change in the voltage on signal lines 105a and 105b is shown in FIG. 6A. As shown in FIG. 6A, since both 105a and 105b are changed in opposite and equal directions, the common mode voltage (VCM) remains the same. This is in contrast to single-sided switching in which case the common mode voltage would have changed by 16 CVref, as shown in FIG. 6B.

Returning to FIG. 3B, a sufficient amount of settling time after the reconfiguration of $202_{N-1}$, the next comparison, for determining the $2^{nd}$ bit, may be performed. During this comparison, if the voltage on 105a is greater than the voltage on 105b (i.e., ½ full-scale voltage>Vin>¼ full-scale voltage), then the comparator output is a '1'. Conversely, if the voltage on 105a less than the voltage on 105b (i.e., Vin<¼ full-scale voltage), then the comparator output is a '0'.

Figure 3C:
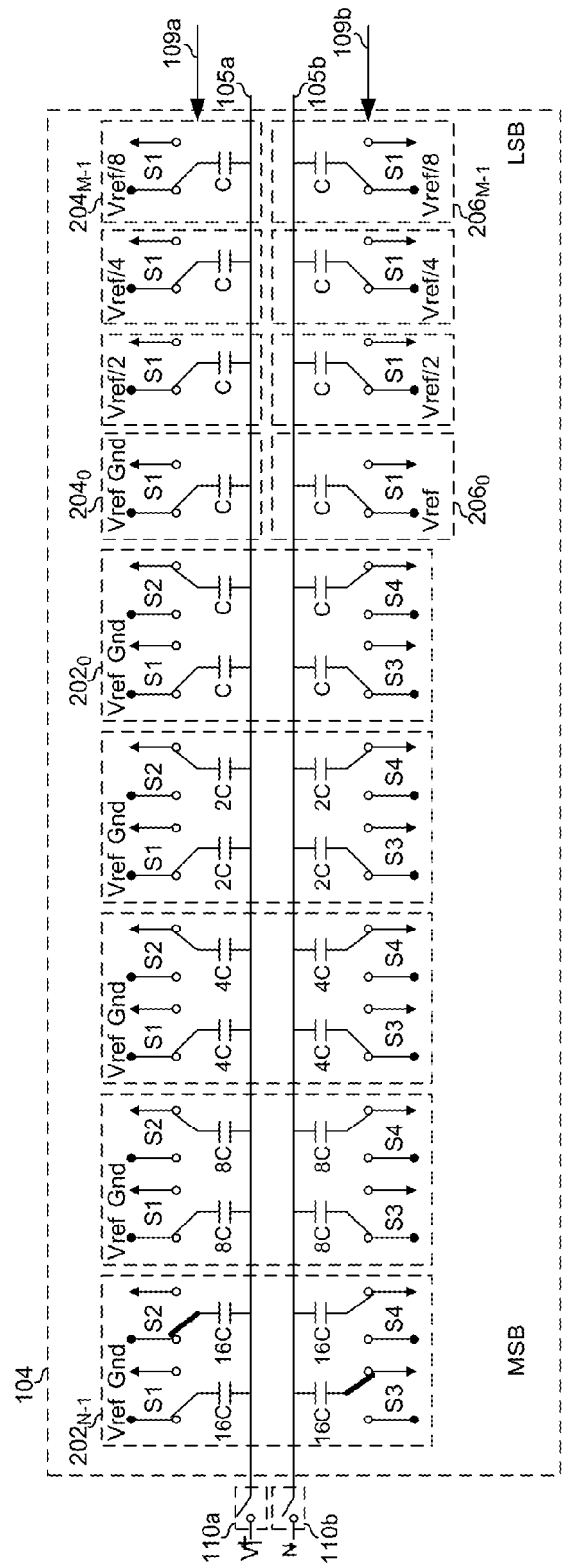
FIG. 3C depicts the ADC of FIG. 1B during a comparison for determining the 2nd bit, assuming the result of the comparison in FIG. 3A was a '0'.

FIG. 3C depicts the ADC of FIG. 1B during a comparison for determining the $2^{nd}$ bit, assuming the result of the comparison in FIG. 3A was a '0'. FIG. 3C may share any and all aspects of the elements of FIGS. 1A-3B. The bold lines in FIG. 3C correspond to switches that have changed position relative to FIG. 3A. As shown, S2 of $202_{N-1}$ has been switched to Vref and S4 has been switched to GND.

A sufficient amount of settling time after the reconfiguration of $202_{N-1}$, the next comparison, for determining the $2^{nd}$ bit, may be performed. During this comparison, if the voltage on 105a is greater than the voltage on 105b (i.e., Vin>¾ full-scale voltage), the comparator output is a '1'. Conversely if the voltage on 105a is less than the voltage on 105b (i.e., ½ full-scale<Vin<¾ full-scale), then comparator output is '0'.

Figure 4A:
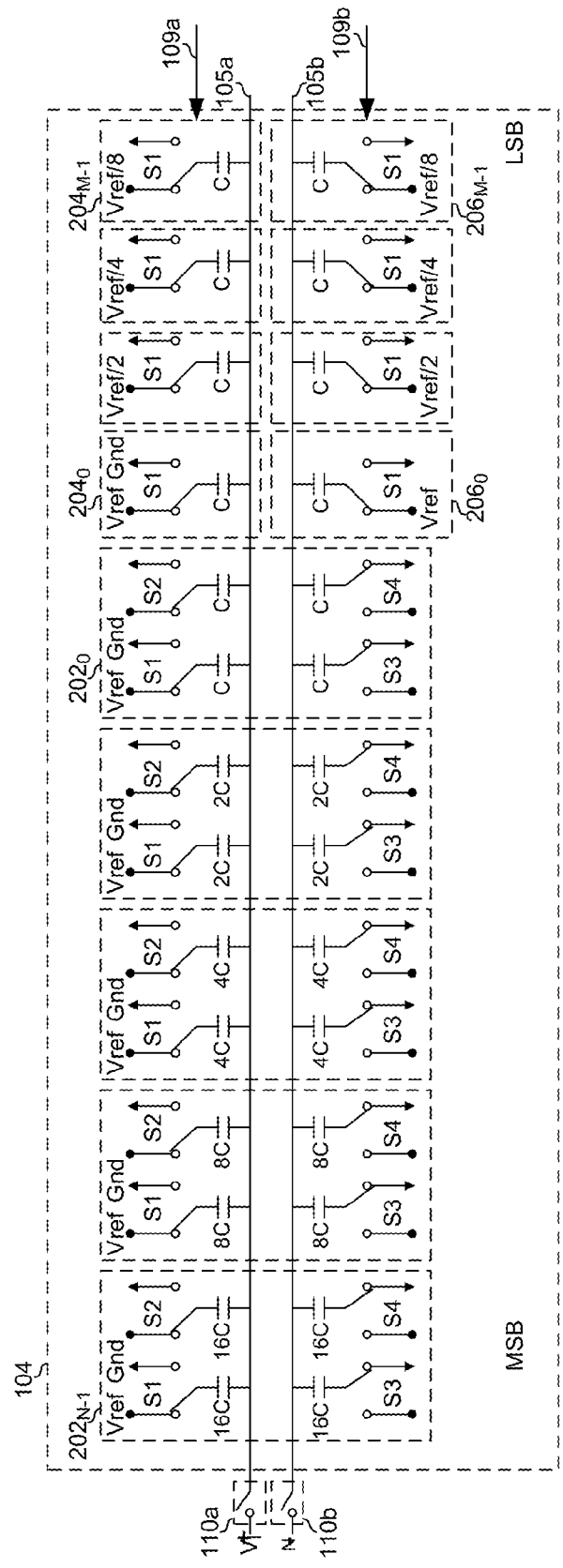
FIG. 4A depicts the ADC of FIG. 1B during a comparison for determining the 6th bit, assuming the 1st through 5th bits were '0'.

FIG. 4A depicts the ADC of FIG. 1 during a comparison for determining the $6^{th}$ bit, assuming the $1^{st}$ through $5^{th}$ bits were '0'. FIG. 4 may share any and all aspects of the elements of FIGS. 1A-3B.

Figure 4B:
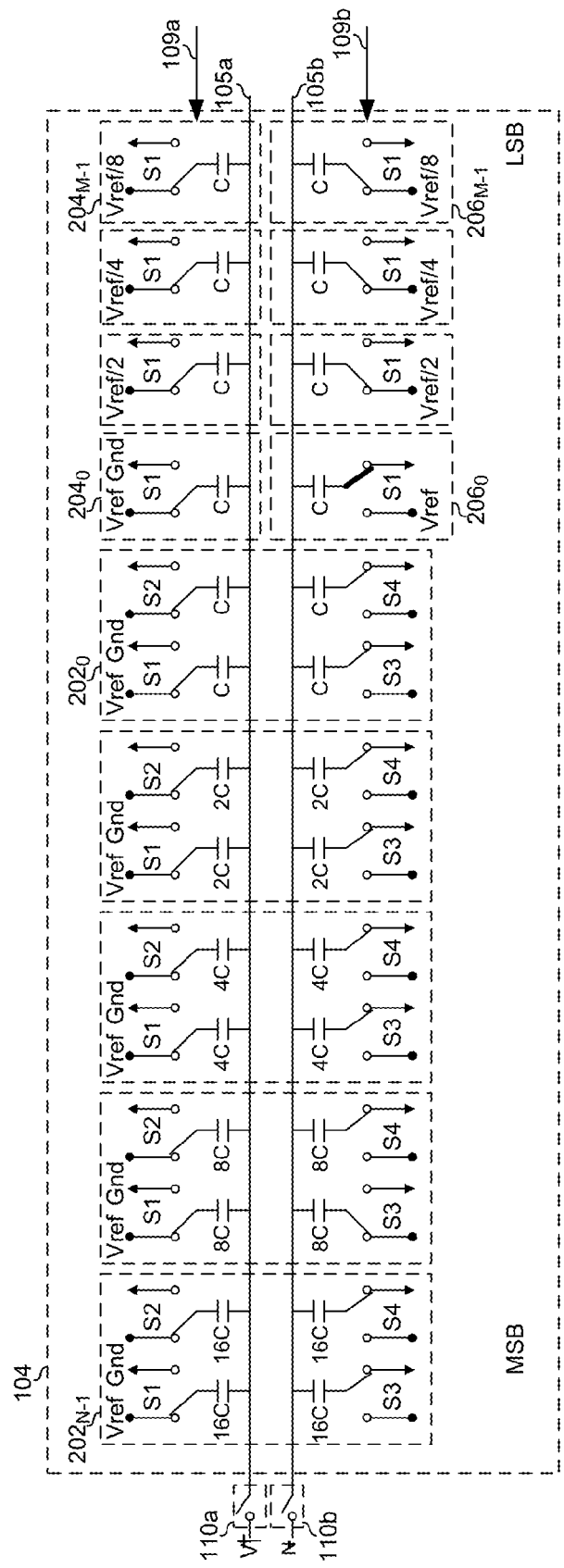
FIG. 4B depicts the ADC of FIG. 1B during a comparison for determining the 7th bit, assuming the result of the comparison in FIG. 4A was a '0'.
Figure 4C:
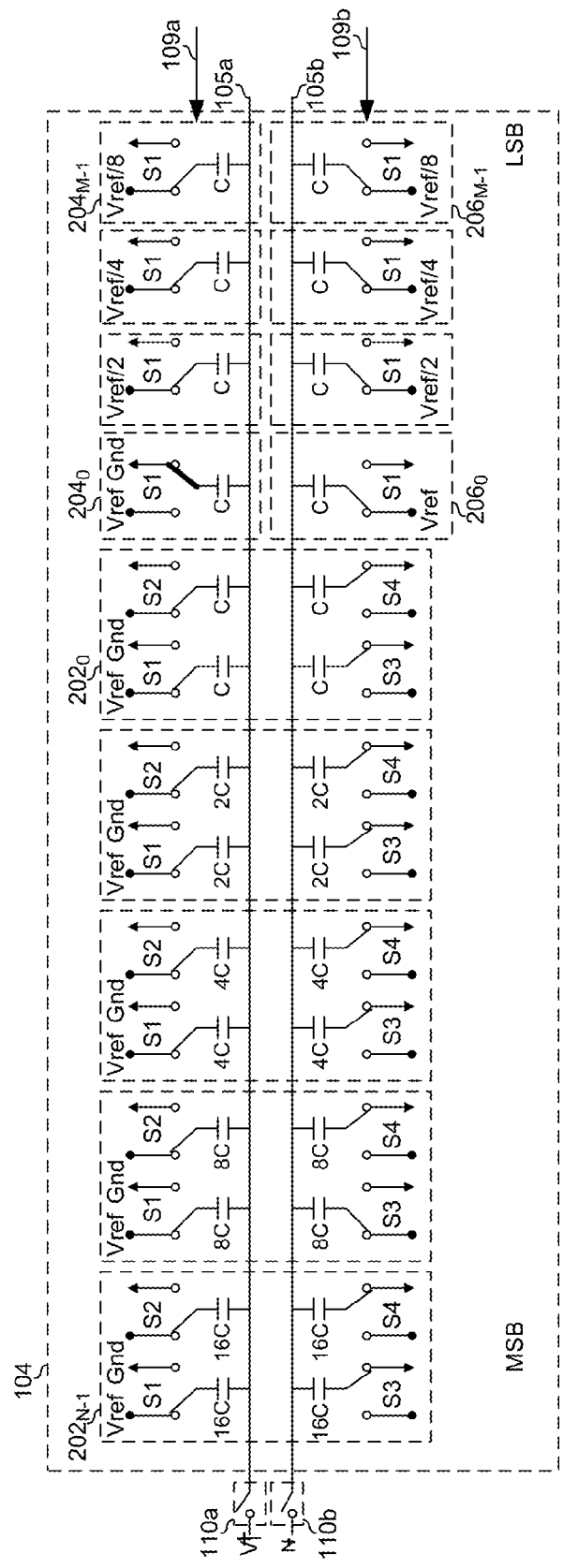
FIG. 4C depicts the ADC of FIG. 1B during a comparison for determining the 8th bit, assuming the result of the comparison in FIG. 4A was a '1'.

During this comparison, if the voltage on 105a is greater than the voltage on 105b (i.e., 1/64 Full Scale<Vin<1/32 Full-scale), then the comparator output is '1' and the DAC 104 is configured as shown in FIG. 4C for the next comparison. In the state shown in FIG. 4A, there is a common mode offset of $-V_{ADC\_fs}/128$.

Conversely, if the voltage on 105a is less than the voltage on 105b (i.e., Vin<1/64 FS), then the comparator output is '0' and the DAC 104 is configured as shown in FIG. 4B for the next comparison. In the state shown in FIG. 4A, there is a common mode offset of $-V_{adc\_fs}/128$. That is, no matter what code it is, once an initial connection is fixed, the common mode offset is constant, independent of input code.

Figure 5:
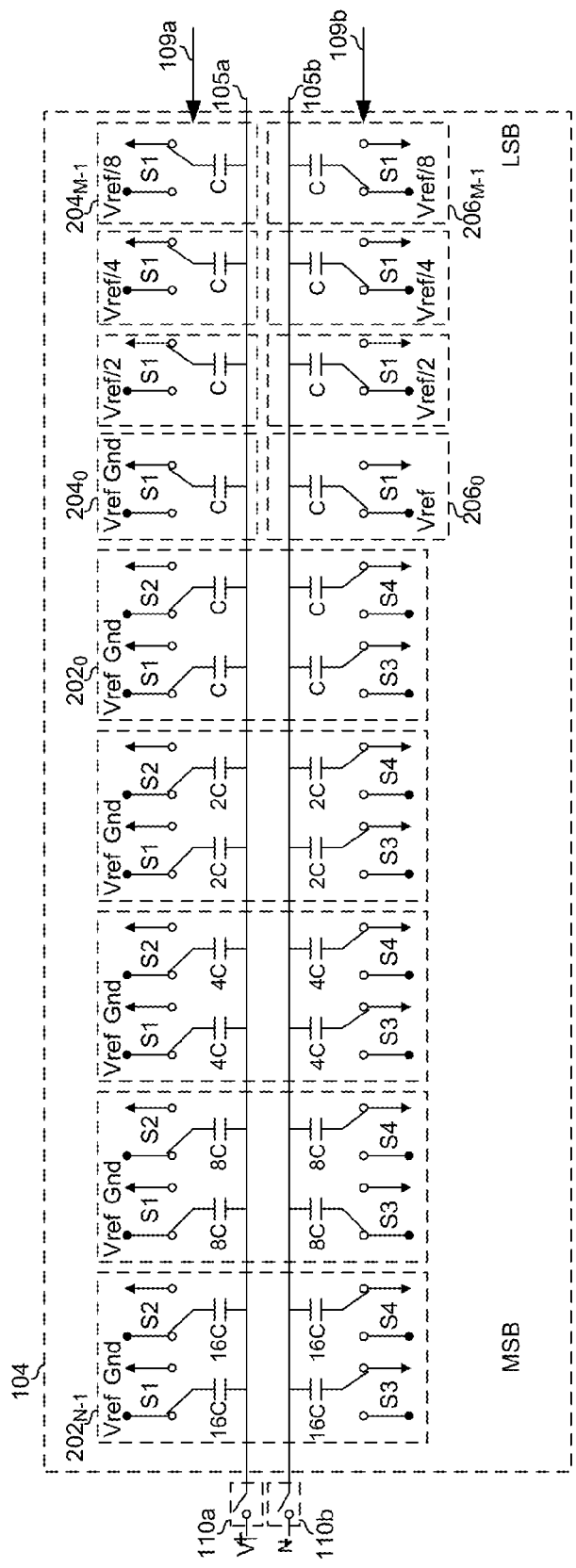
FIG. 5 depicts the ADC of FIG. 1B after completion of converting a value of '000001111'.

FIG. 5 depicts the ADC of FIG. 1 after completion of converting a value of '000001111'. In the case where each single-side switch initially connects to Vref, the common mode offset may be $-(V_{ADC\_fs}/128+V_{ADC\_fs}/256+V_{ADC\_fs}/512+V_{ADC\_fs}/1024)$, where $V_{ADC\_fs}$ comprises the full-scale voltage of the ADC. Thus, for Vref=500 mV, Voffset=−7.1 mV. In another example where each of the single-side switches initially connects to ground, the common mode offset may be determined by: $+(V_{ADC\_fs}/128+V_{ADC\_fs}/256+V_{ADC\_fs}/512+V_{ADC\_fs}/1024)$, resulting in +7.1 mV with a Vref=500 mV.

The full-scale voltage of the ADS may be reduced from Vref by the factor of MSB capacitance times 2 divided by the entire capacitance on one side of the double-sided switched capacitors (that is, in this case ((16+16)×2)/66), which is thus slightly smaller than Vref. The entire capacitance means in single side, either + or −, the total capacitance of the ADC shown in FIGS. 1A-5 is thus: (16+16)+(8+8)+(4+4)+(2+2)+(1+1)+1+1+1+1=66.

A common mode offset of the ADC relies on each of initial connection of single-side switches network. Once the single-side switches initial connection is fixed, common mode offset may be constant after the whole conversion, independent of the codes and input.

In an embodiment of the disclosure, a method and system for an analog-to-digital converter with near-constant common mode voltage may comprise one or more circuits comprising an analog-to-digital converter (ADC) comprising sampling switches on each of two input lines to the ADC, N double-sided switched capacitors, and M single-sided switched capacitors on each input line, said one or more circuits operable to: sample an input voltage by closing the sampling switches, open the sampling switches and compare voltage levels between the input lines, iteratively switch the double-sided switched capacitors between a reference voltage (Vref) and ground based on the compared voltage levels, and iteratively switch the single-sided switched capacitors between ground and voltages that are a fraction of Vref.

The voltages that are a fraction of Vref may equal $Vref/2^x$ where x ranges from 0 to m−1 and m is a number of single-sided switched capacitors per input line. A common mode offset of the ADC may be less than $V_{adc\_fs}/128+V_{adc\_fs}/256+V_{adc\_fs}/512+V_{adc\_fs}/1024$ when m equals 4. The single-sided switched capacitors and the double-sided switched capacitors may be controlled utilizing successive approximation register (SAR) logic.

The voltage levels may be compared utilizing a comparator. Outputs of the comparator may be coupled to the SAR logic. The sampling switches may be controlled utilizing bootstrapping circuits. The capacitance values of the double-sided switched capacitors may be binary coded. The most significant bit (MSB) may be determined using one of the double-sided switched capacitors and the least significant bit (LSB) may be determined using one of the single-sided switched capacitors.

Other embodiments of the disclosure may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the steps as described herein for an analog-to-digital converter with near-constant common mode voltage.

Accordingly, aspects of the disclosure may be realized in hardware, software, firmware or a combination thereof. The disclosure may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present disclosure may be implemented as a board level product, as a single chip, application specific integrated circuit (ASIC), or with varying levels integrated on a single chip with other portions of the system as separate components. The degree of integration of the system is primarily determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present disclosure may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present disclosure.

While the disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiments disclosed, but that the present disclosure will include all embodiments falling within the scope of the appended claims.

What is claimed is:

1. A method for communication, the method comprising:
   in an analog-to-digital converter (ADC) comprising a first sampling switch on a first input line to the ADC, a second sampling switch on a second input line to the ADC, N switched capacitor pairs and M single switched capacitors on said first input line, and N switched capacitor pairs and M single switched capacitors on said second input line:
   sampling an input voltage by closing the first and second sampling switches;
   opening the first and second sampling switches and comparing voltage levels between the input lines;
   iteratively switching the switched capacitor pairs between a reference voltage (Vref) and ground based on the compared voltage levels; and
   iteratively switching the single switched capacitors between ground and voltages that are a fraction of Vref.

2. The method according to claim 1, wherein the voltages that are a fraction of Vref equal $V_{ref}/2^x$ where x ranges from 0 to m−1 and m is a number of single-switched capacitors per input line.

3. The method according to claim 2, wherein a magnitude of a common mode offset of the ADC is less than $V_{ADC\_fs}/128 + V_{ADC\_fs}/256 + V_{ADC\_fs}/512 + V_{ADC\_fs}/1024$ when m equals 4 and where $V_{ADC\_fs}$ is a full-scale voltage of the ADC.

4. The method according to claim 1, comprising controlling the single switched capacitors and the switched capacitor pairs utilizing successive approximation register (SAR) logic.

5. The method according to claim 4, comprising comparing the voltage levels utilizing a comparator.

6. The method according to claim 5, wherein outputs of the comparator are coupled to the SAR logic.

7. The method according to claim 1, comprising controlling the sampling switches utilizing bootstrapping circuits.

8. The method according to claim 1, wherein capacitance values of the switched capacitor pairs are binary coded.

9. The method according to claim 1, comprising determining the most significant bit (MSB) using one of the switched capacitor pairs.

10. The method according to claim 1, comprising determining the least significant bit (LSB) using one of the single switched capacitors.

11. A system for communication, the system comprising:
    one or more circuits comprising an analog-to-digital converter (ADC) comprising a first sampling switch on a first input line to the ADC, a second sampling switch on a second input line to the ADC, N switched capacitor pairs and M single switched capacitors on said first input line, and N switched capacitor pairs and M single switched capacitors on said second input line said one or more circuits being operable to:
    sample an input voltage by closing the first and second sampling switches;
    open the first and second sampling switches and compare voltage levels between the input lines;
    iteratively switch the switched capacitor pairs between a reference voltage (Vref) and ground based on the compared voltage levels; and
    iteratively switch the single switched capacitors between ground and voltages that are a fraction of Vref.

12. The system according to claim 11, wherein the voltages that are a fraction of Vref equal $V_{ref}/2^x$ where x ranges from 0 to m−1 and m is a number of single-switched capacitors per input line.

13. The system according to claim 12, wherein a magnitude of a common mode offset of the ADC is less than $V_{ADC\_fs}/128 + V_{ADC\_fs}/256 + V_{ADC\_fs}/512 + V_{ADC\_fs}/1024$ when m equals 4 and where $V_{ADC\_fs}$ is a full-scale voltage of the ADC.

14. The system according to claim 11, wherein said one or more circuits are operable to control the single switched capacitors and the switched capacitor pairs utilizing successive approximation register (SAR) logic.

15. The system according to claim 14, wherein said one or more circuits are operable to compare the voltage levels utilizing a comparator.

16. The system according to claim 15, wherein outputs of the comparator are coupled to the SAR logic.

17. The system according to claim 11, wherein said one or more circuits are operable to control the first and second sampling switches utilizing bootstrapping circuits.

18. The system according to claim 11, wherein capacitance values of the switched capacitor pairs are binary coded.

19. The system according to claim 11, wherein said one or more circuits are operable to determine the most significant bit (MSB) using one of the switched capacitor pairs and determine the least significant bit (LSB) using one of the single switched capacitors.

20. A system for communication, the system comprising:
    one or more circuits comprising an analog-to-digital converter (ADC) comprising a first sampling switch on a first input lines to the ADC, a second sampling switch on a second input line to the ADC, a comparator, N switched capacitor pairs and M single switched capacitors on said first input line, and N switched capacitor pairs and M single switched capacitors on said second input line, said one or more circuits being operable to:

sample an input voltage by closing the first and second sampling switches;

open the first and second sampling switches and compare voltage levels between the input lines utilizing the comparator;

iteratively switch the switched capacitor pairs between a reference voltage (Vref) and ground and compare voltage levels between the first and second input lines utilizing the comparator; and iteratively switch the single switched capacitors between ground and voltages that are a fraction of Vref and compare voltage levels between the first and second input lines utilizing the comparator.

* * * * *